United States Patent
Ho et al.

(10) Patent No.: US 11,916,030 B2
(45) Date of Patent: Feb. 27, 2024

(54) METHOD FOR MANUFACTURING SIDE WETTABLE PACKAGE

(71) Applicant: PANJIT INTERNATIONAL INC., Kaohsiung (TW)

(72) Inventors: Chung-Hsiung Ho, Kaohsiung (TW); Chi-Hsueh Li, Tainan (TW)

(73) Assignee: PANJIT INTERNATIONAL INC., Kaohsiung (TW)

( * ) Notice: Subject to any disclaimer, the term of this patent is extended or adjusted under 35 U.S.C. 154(b) by 188 days.

(21) Appl. No.: 17/726,863

(22) Filed: Apr. 22, 2022

(65) Prior Publication Data

US 2022/0246561 A1 Aug. 4, 2022

Related U.S. Application Data

(62) Division of application No. 17/014,417, filed on Sep. 8, 2020, now Pat. No. 11,387,203.

(51) Int. Cl.
*H01L 23/31* (2006.01)
*H01L 23/00* (2006.01)

(52) U.S. Cl.
CPC .......... *H01L 24/05* (2013.01); *H01L 23/3114* (2013.01); *H01L 24/03* (2013.01); *H01L 24/96* (2013.01); *H01L 24/97* (2013.01); *H01L 2224/03462* (2013.01); *H01L 2224/05557* (2013.01); *H01L 2924/1203* (2013.01); *H01L 2924/37001* (2013.01)

(58) Field of Classification Search
CPC ................. H01L 24/05; H01L 23/3114; H01L 2224/03462
See application file for complete search history.

(56) References Cited

U.S. PATENT DOCUMENTS

| 6,420,779 | B1 | 7/2002 | Sharma et al. |
| 6,709,898 | B1* | 3/2004 | Ma ..................... H01L 23/3128 |
| | | | 257/E23.101 |
| 9,536,800 | B2 | 1/2017 | Ashrafzadeh et al. |
| 2008/0067640 | A1* | 3/2008 | Do .................... H01L 23/49541 |
| | | | 257/E23.039 |
| 2014/0001614 | A1 | 1/2014 | Cho |

FOREIGN PATENT DOCUMENTS

TW 202018829 A 5/2020

* cited by examiner

*Primary Examiner* — Dale E Page
*Assistant Examiner* — Wilner Jean Baptiste
(74) *Attorney, Agent, or Firm* — Birch, Stewart, Kolasch & Birch, LLP (57) ABSTRACT

A side wettable package includes a molding compound, a chip and multiple conductive pads exposed from a bottom surface of the molding compound. The conductive pads include peripheral conductive pads arranged near a side wall of the molding compound. Each of the peripheral conductive pads is over etched to form an undercut. When the side wettable package is connected to a circuit board via solder, the solder ascends to the undercut of the peripheral conductive pads for improving connection yield and facilitating inspection of soldering quality.

4 Claims, 7 Drawing Sheets

METHOD FOR MANUFACTURING SIDE WETTABLE PACKAGE

CROSS REFERENCE TO RELATED APPLICATIONS

This application is a divisional application (DIV) of U.S. patent application Ser. No. 17/014,417, filed on Sep. 8, 2020, the disclosures of which are incorporated herein by reference.

BACKGROUND OF THE INVENTION

1. Field of the Invention

The present invention relates to a semiconductor package, particularly to a side wettable package and a method for manufacturing the same.

2. Description of the Related Art

For a conventional quad flat no-lead (QFN) package or a dual flat no-lead (DFN) package, multiple conductive pads are formed on a bottom surface of the package. When the QFN/DFN package is soldered to a circuit board, it is not easy to inspect soldering connection between the package and the circuit board using visual inspection technique because the conductive pads have been obscured. Therefore, another type of QFN/DFN package with an exposed internal metal lead frame around a side wall of the QFN/DFN package is proposed. In a reflow soldering process, such exposed lead frame allows the side wall of the QFN/DFN package to be wetted with solder. As a result, it is much easier to inspect soldering connection between the QFN/DFN package and the circuit board. Such QFN/DFN package with exposed lead frame for purpose of observing solder is named as side wettable package.

Figure 3A:
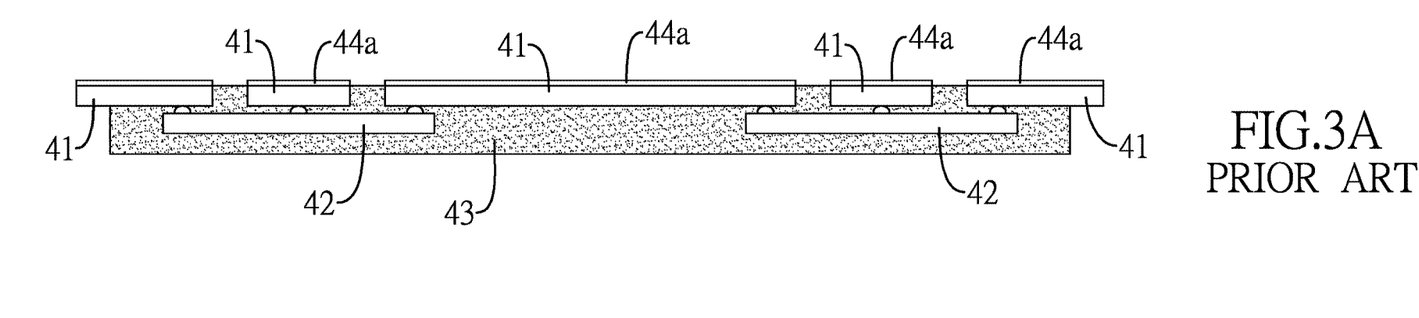
FIGS. 3A to 3D are cross-sectional views showing a method of manufacturing a conventional semiconductor package.

With reference to FIGS. 3A to 3D, a conventional QFN packaging process is illustrated as an example. As shown in FIG. 3A, a plurality of chips 42 are attached on a lead frame 41 and encapsulated by a molding compound 43. The lead frame 41 may be made of copper or other conductive materials. A solder layer 44a is plated on a bottom surface of the lead frame 41 by an electroplating process. In short, the configuration in FIG. 3A is a semi-finished product that has been processed through the die-bonding, molding and electroplating processes.

Figure 3B:
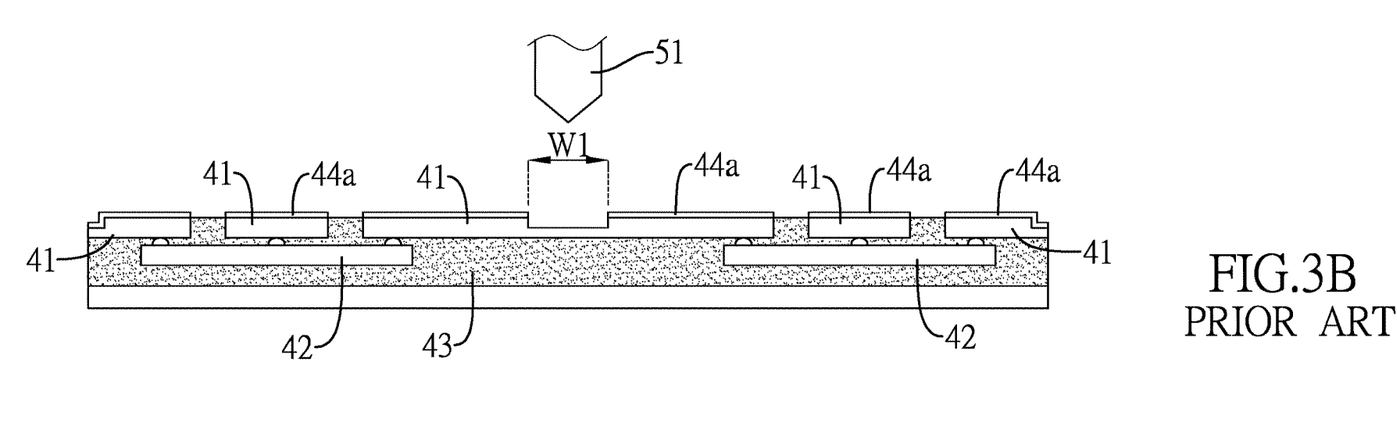

As shown in FIG. 3B, a first sawing blade 51 having a first width W1 is applied to perform a half-cut on the lead frame 41 from the solder layer 44a along a predetermined cutting path. A depth of the half-cut approximates to a half thickness of the lead frame 41.

Figure 3C:
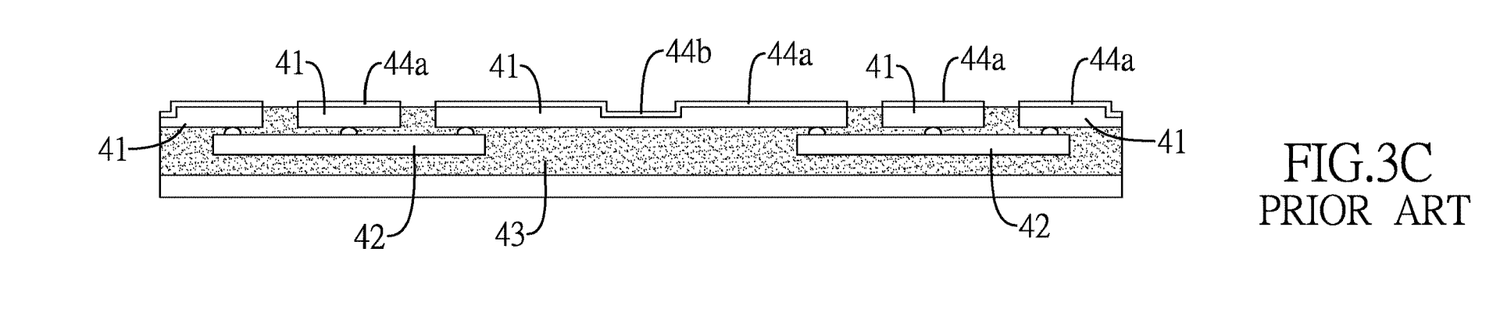

As shown in FIG. 3C, the lead frame 41 is then electroplated to form another soldering layer 44b coated on the exposed lead frame 41 in the half-cut.

Figure 3D:
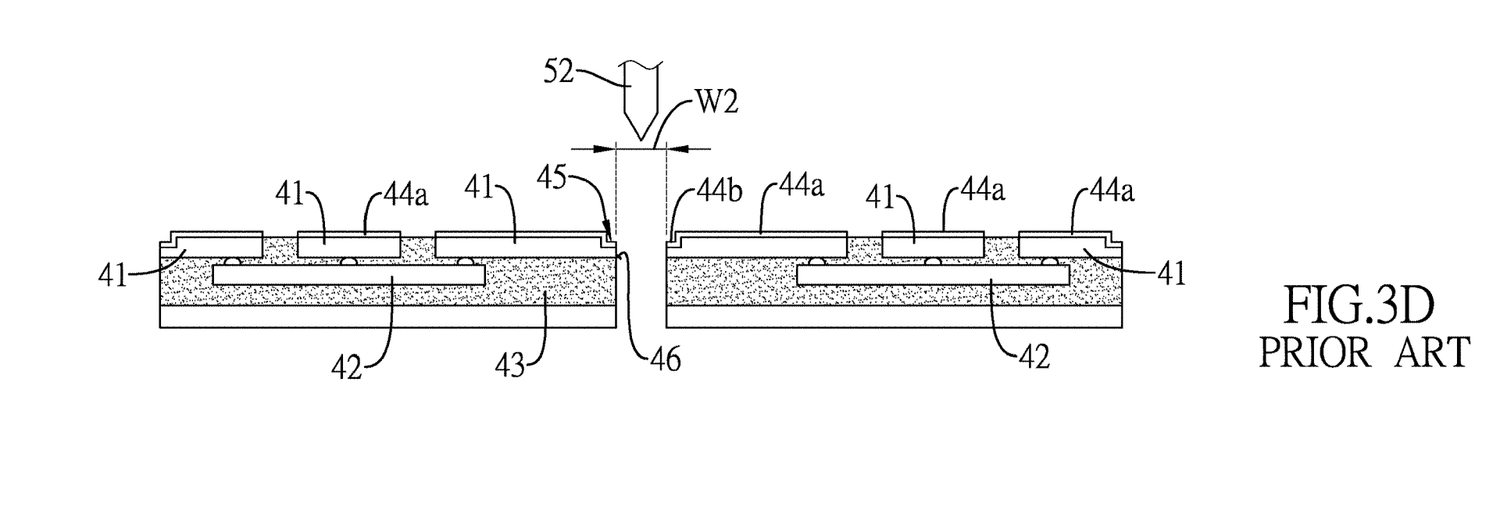

As shown in FIG. 3D, a second sawing blade 52 having a second width W2 is then applied to perform a singulation process by fully cutting the lead frame 41 to form multiple individual packages. The second width W2 is smaller than the first width W1. By cutting the lead frame 41 twice with the sawing blades 51 and 52 of different widths W1 and W2, a stepped portion 45 is formed on a side wall of the package.

However, with regard to the package discussed above, it may have the following defects.

1. The lead frame 41 must have a sufficient thickness for cutting twice, i.e. the half-cut and the full-cut. However, when using a thick lead frame 41 in the manufacturing process, it is difficult to reduce the height of the package.

2. Half-cut process for the lead frame 41 must be precisely controlled to avoid an excessive sawing or an accidental cut off.

3. As shown in FIG. 3C, burrs 46 resulted from the lead frame 41 may remain on the side wall of the package after the full-cut process. When adjacent burrs 46 are too close to each other, the burrs 46 may cause a short circuit.

4. After the full-cut process, the lead frame 41 made of copper is exposed from the side wall of the package without any protective layer. As a result, copper oxide may be formed on the cross section of the lead frame 41.

Figure 4A:
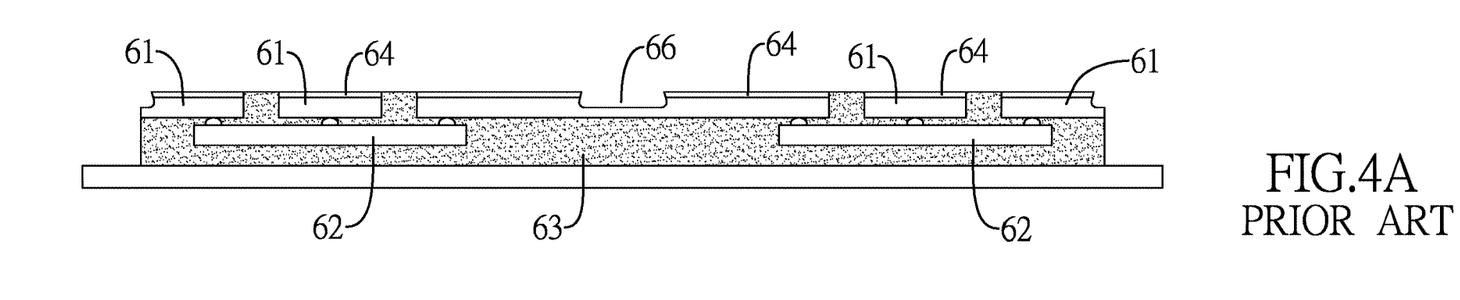
FIGS. 4A to 4C are cross-sectional views showing a method of manufacturing another type of conventional semiconductor package.
Figure 4B:
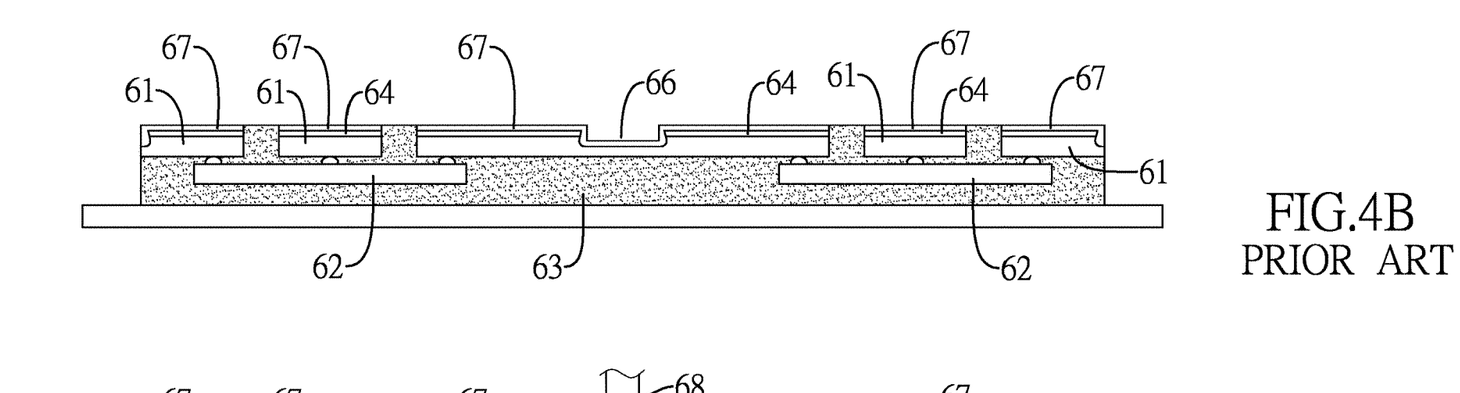
Figure 4C:
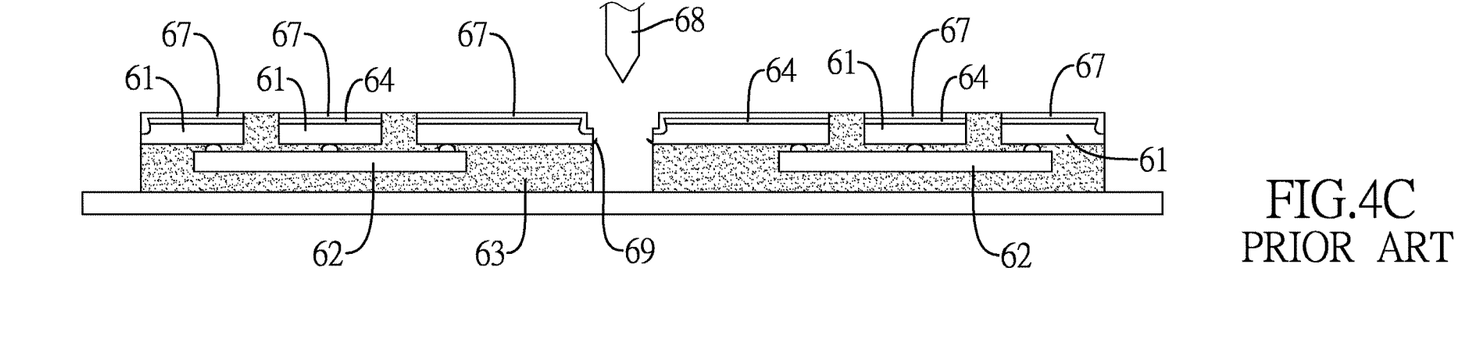

With reference to FIGS. 4A to 4C, another conventional QFN packaging process is illustrated. FIG. 4A shows a semi-finished product manufactured by die-bonding, molding, and electroplating processes. The semi-finished product comprises a lead frame 61, a plurality of chips 62 mounted on the lead frame 61, a molding compound 63 for encapsulating the plurality of chips 62, and a plating layer 64 formed on a surface of the lead frame 61 through electroplating process. The plating layer 64 may be a nickel-palladium (NiPd) layer, a nickel-palladium-gold (NiPdAu) layer or other proper materials for surface protection. A carrier such as a tape or a film 65 is adhered under the molding compound 63 for supporting the semi-finished product.

The plating layer 64 can be used as a hard mask for etching process. A region on the lead frame 61 that is uncovered by the plating layer 64 will be etched to form a recess 66. The position of the recess 66 is defined as a singulation region that is to be cut for separating adjacent packages. The depth of the recess 66 approximates to a half thickness of the lead frame 61, wherein partial lead frame 61 is exposed from the recess 66.

As shown in FIG. 4B, an electroplating process is performed to form a solder layer 67 on the plating layer 64 and on the lead frame 61 that is exposed from the recess 66.

As shown in FIG. 4C, the lead frame 61 and the molding compound 63 are then completely cut off by a sawing blade 68 along the recess 66 to form multiple individual packages.

The package introduced in FIGS. 4A-4C also have the following drawbacks.

1. The lead frame 61 should be sufficiently thick for etching and cutting processes. Such a thick lead frame 61 is unfavorable to minimize the size of the package.

2. Etching process of the lead frame 61 must be precisely controlled to avoid over etching.

3. As shown in FIG. 4C, burrs 69 may still remain on the side wall of the package after the cutting process.

4. After the cutting process, the lead frame 61 exposes its cross section from the side wall of the package such that copper oxide may be formed on the cross section.

SUMMARY OF THE INVENTION

An objective of the present disclosure is to provide a side wettable package. The side wettable package comprises:

a molding compound having a bottom surface and a side wall;

a chip encapsulated in the molding compound; and a plurality of conductive pads electrically connected to the chip with each conductive pad being partially embedded in the molding compound and exposed from the bottom surface of the molding compound; wherein the plurality of conductive pads comprises multiple peripheral conductive pads distributed near the side wall of the molding compound, and each of the peripheral conductive pads has a side surface and forms an undercut on the side surface;

wherein each undercut has a concave surface curved inward relative to the side wall of the molding compound and having a height equal to a thickness of the peripheral conductive pads.

Another objective of the present disclosure is to provide a manufacturing method of a side wettable package. The method comprises:

manufacturing a semi-finished package being attached on a carrier, wherein the semi-finished product comprises
 a lead frame having a bottom surface attached to the carrier and a top surface opposite to the bottom surface;
 multiple chips electrically mounted on the top surface of the lead frame; and a molding compound encapsulating the chips and the lead frame;

sawing the molding compound and the lead frame along a predetermined cutting path downward from a top surface of the molding compound to form a plurality of packages separated from each other; wherein the lead frame in each package forms a plurality of conductive pads including peripheral conductive pads distributed near a side wall of the molding compound of the package, and each peripheral conductive pads has a side surface; and over etching each of the peripheral conductive pads to form an undercut at the side surface of the peripheral conductive pad, wherein each undercut has a concave surface curved inward relative to the side wall of the molding compound and having a height equal to a thickness of the peripheral conductive pads.

In comparison to the conventional package, the present disclosure does not need to cut the lead frame twice or to sequentially etch and cut the lead frame. Therefore, a thinner lead frame is applicable to simplify the manufacturing processes, reduce the thickness of the package, and lower the manufacturing costs.

Other objectives, advantages and novel features of the invention will become more apparent from the following detailed description when taken in conjunction with the accompanying drawings.

DETAILED DESCRIPTION OF THE INVENTION

The present disclosure relates to a semiconductor package such as a quad flat no-lead (QFN) package or a dual flat no-lead (DFN) package. In the following description, a diode package is taken as an example of the semiconductor package for purpose of describing the present disclosure.

Figure 1A:
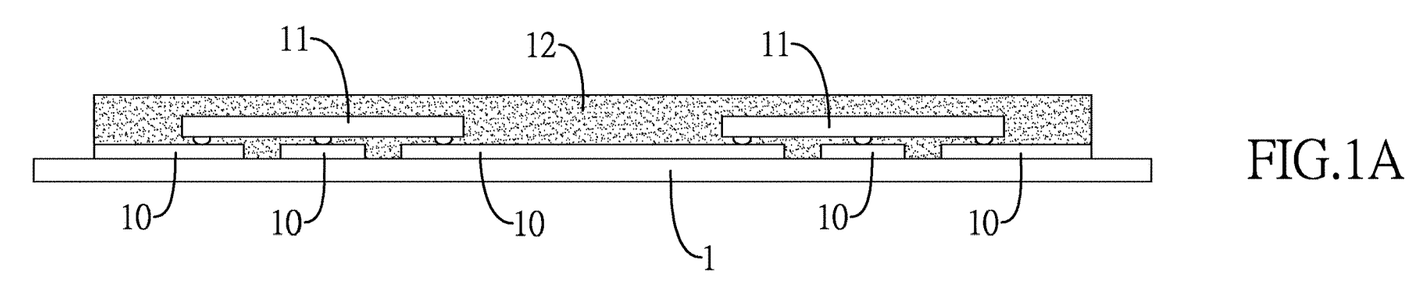
FIGS. 1A to 1F are cross-sectional views showing a process of manufacturing a side wettable package in accordance with the present disclosure.

With reference to FIG. 1A, a semi-finished product is attached on a carrier 1 such as a tape or a film to conveniently transfer or move the semi-finished product in packaging processes. The semi-finished product is manufactured by processes of die-bonding, chip connecting and molding. The semi-finished product comprises a lead frame 10, chips 11 and a molding compound 12. A bottom surface of the lead frame 10 is attached on the carrier 1. Each of the chips 11 is attached on a top surface of the lead frame 10 and may be electrically connected to the lead frame 10 through different ways such as wire-bonding, flip chip bonding, etc. The molding compound 12 covers the chips 11 and the lead frame 10. There is sufficient space between adjacent chips 11 for sawing process.

Figure 1B:
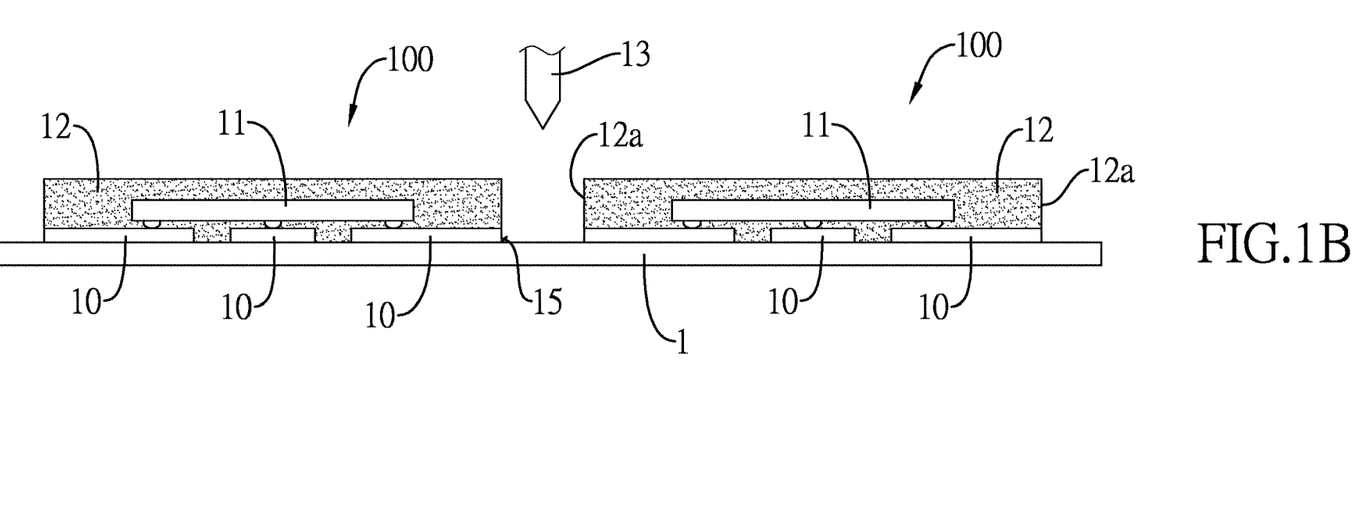
Figure 2:
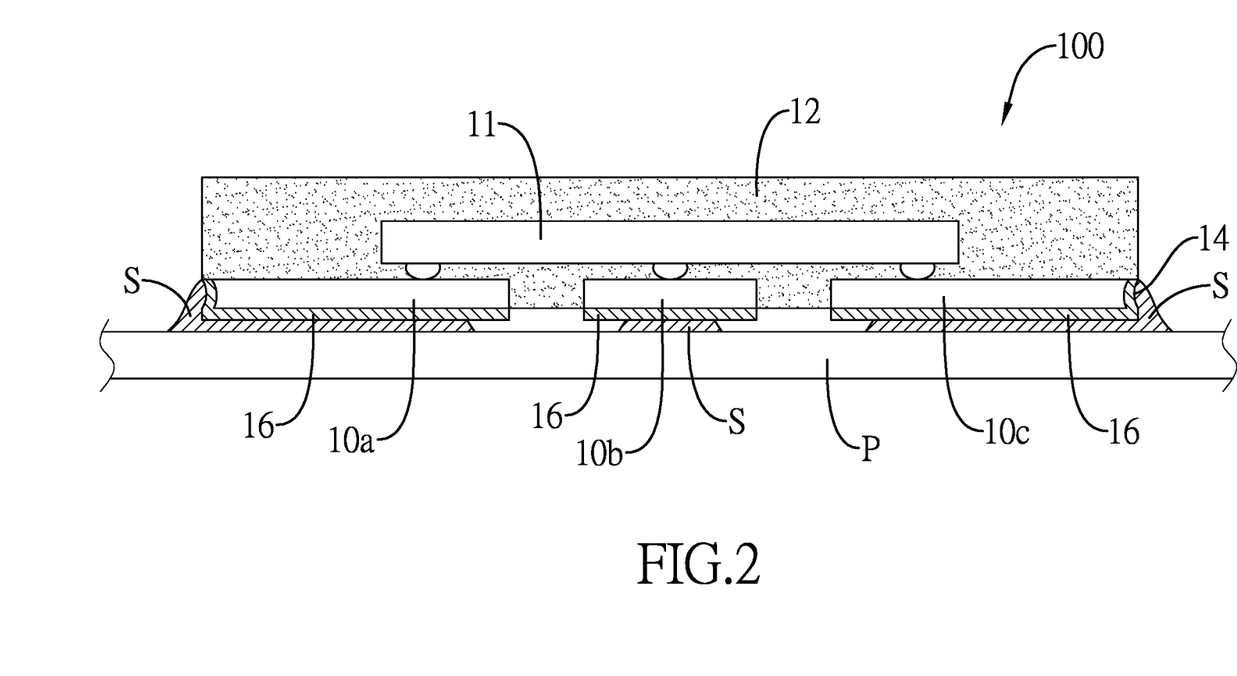
FIG. 2 is a cross-sectional view showing the present disclosure being mounted on a circuit board.

As shown in FIG. 1B, in the sawing process, a sawing blade 13 is applied to cut the molding compound 12 along a predetermined cutting path. The molding compound 12 and the lead frame 10 are cut downward from a top surface of the molding compound 12 to form a plurality of individual packages 100 separated from each other. For each of the packages 100, the lead frame 10 has been cut to form a plurality of conductive pads 10a-10c as shown in FIG. 2, with peripheral conductive pads 10a, 10c distributed near a side wall 12a of the molding compound 12 of the package 100. Each peripheral conductive pad 10a, 10c has a side surface, i.e. a cross section of the lead frame 10.

Figure 1C:
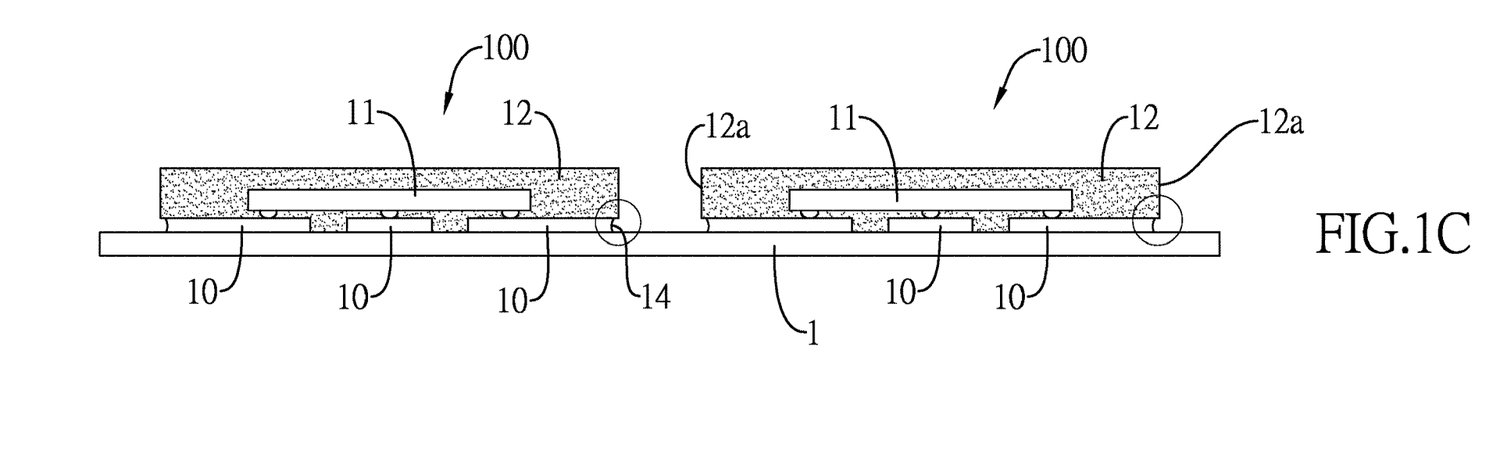
Figure 1D:
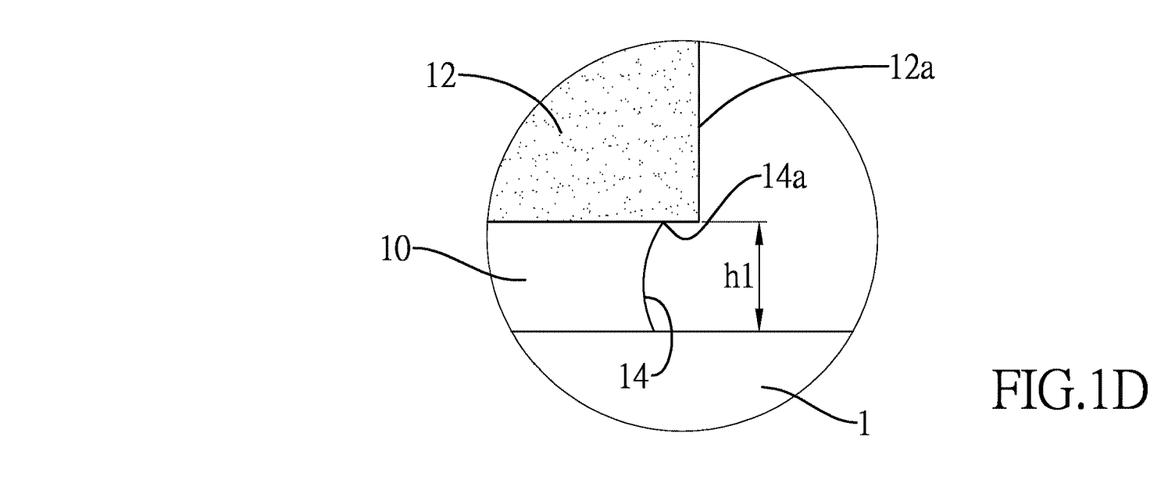

As shown in FIG. 1C, an over etching process is carried out after the sawing process. The lead frame 10 is deliberately over etched by controlling the etching time to form an undercut 14 on the cross section of the lead frame 10, i.e. on the side surface of each peripheral conductive pad 10a, 10c. The undercut 14 has a concave surface curved inward relative to the side wall 12a of the molding compound 12. As shown in FIG. 1D, the concave surface has a height hi equal to the thickness of the lead frame 10. The top most edge 14a of the concave surface of the undercut 14 abuts the molding compound 12. Even if the lead frame 10 forms burrs 15 at its cross sections in the sawing process as shown in FIG. 1B, the burrs 15 will be removed by this etching process. Because the undercut 14 is deliberately formed by over etching the lead frame 10, precise and complex control for the etching process is unnecessary. Even if the lead frame 10 is etched over the predetermined extent, such etching is tolerable.

Figure 1E:
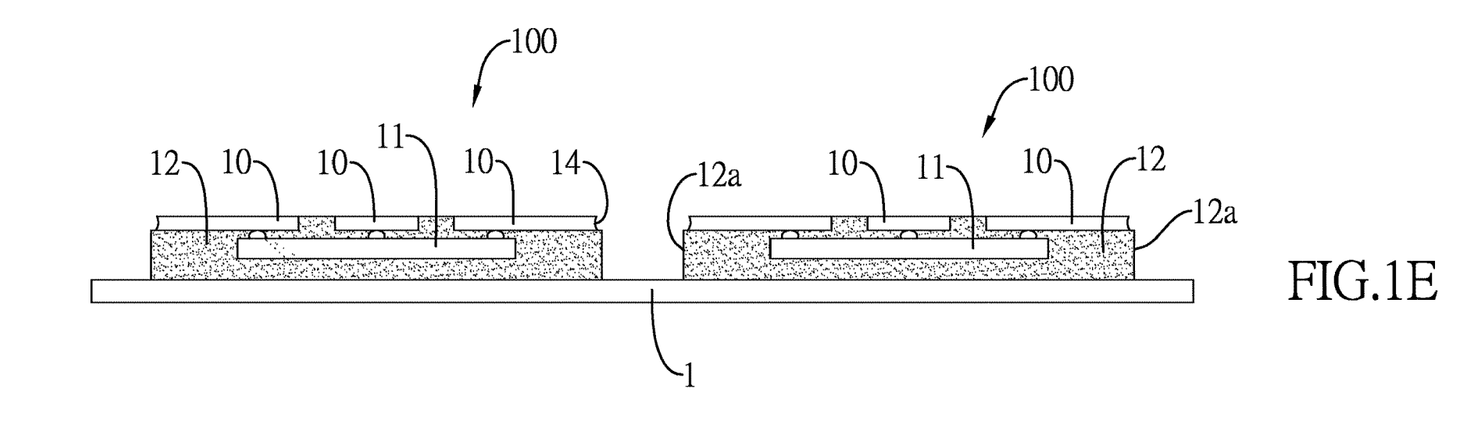

As shown in FIG. 1E, after the etching process, each package 100 is re-mounted by turning over such that the bottom surface of the lead frame 10 originally attached to the carrier 1 is turned upward and exposed.

Figure 1F:
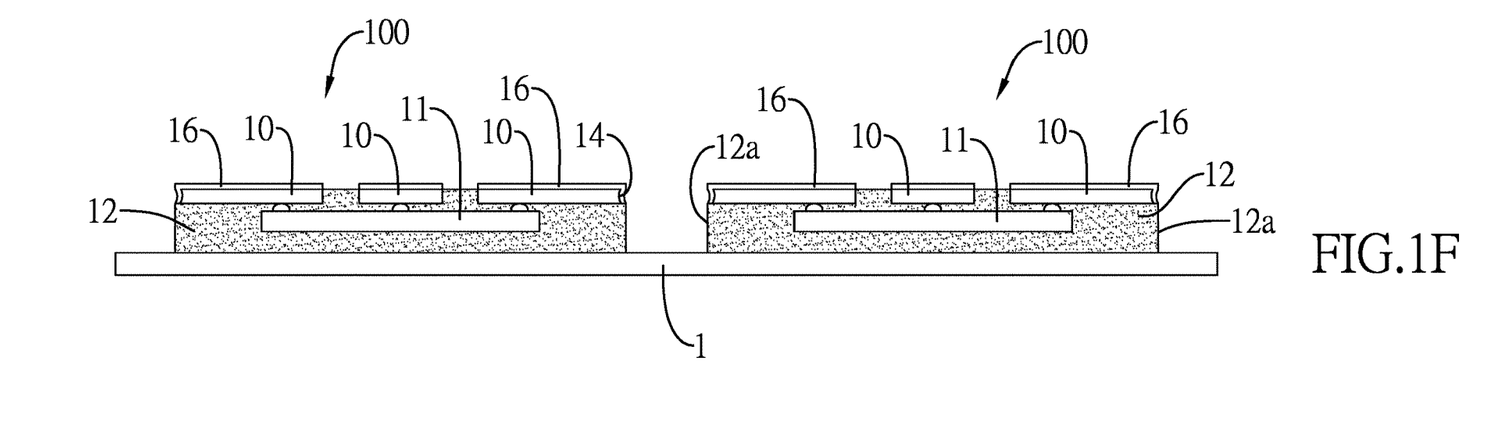

As shown in FIG. 1F, after re-mounting the packages 100, the exposed bottom surface of the lead frame 10, i.e. each of the conductive pads 10a-10c, is electroplated with a protection layer 16. The material of the plating layer 16 may be selected from surface protection materials such as tin, aurum, silver, nickel-aurum, etc. The electroplating method may be selected from the immersion tin process, the electroless nickel immersion gold (ENIG) process, the barrel plating process, the immersion silver process, etc. Since all exposed portions of the lead frame 10 are electroplated with the protection layer 16, the problem of copper exposure is eliminated. After forming the protection layer 16, the carrier 1 will be removed and subsequent processes such as marking may be further carried out.

With reference to FIG. 2, as an example, a package 100 in accordance with the present disclosure is soldered on a circuit board P. The lead frame 10 forms a plurality of conductive pads 10a-10c of the package 100. The plurality of conductive pads 10a-10c includes some peripheral conductive pads 10a, 10c near the side wall 12a of the molding compound 12. Each of the peripheral conductive pads 10a, 10c forms an undercut 14. When the package 100 is connected to the circuit board P, the solder S is applied under each conductive pad 10a-10c and further ascends to the undercut 14 of the peripheral conductive pads 10a, 10c. The solder S ascends approximately from the surface of the circuit board P to a junction where the conductive pads 10a, 10c abut the molding compound 12 such that the protection layer 16 at the side surface of the package 100 is completely covered by the solder S.

In comparison to conventional side wettable packages, the package 100 in accordance with the present disclosure has advantages as follows.

1. Using thin lead frame: Since the lead frame does not need to be cut twice, or be sequentially etched and cut, a thin lead frame 10 is applicable in the present disclosure to manufacture a thinned package 100. This not only facilitates the manufacturing processes and reduces the thickness of the package by reducing package step, but also lowers the manufacturing cost.

2. Eliminating the burrs 15: The lead frame will be etched after the sawing process to remove the burrs. Therefore, even if there are burrs 15 resulted from the sawing process, all the burrs will be etched to avoid the short circuit problem.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A method for manufacturing a side wettable package, the method comprising:
    manufacturing a semi-finished package being attached on a carrier, wherein the semi-finished product comprises a lead frame having a bottom surface attached to the carrier and a top surface opposite to the bottom surface; multiple chips electrically mounted on the top surface of the lead frame; and a molding compound encapsulating the chips and the lead frame;
    sawing the molding compound and the lead frame along a predetermined cutting path downward from a top surface of the molding compound to form a plurality of packages separated from each other; wherein the lead frame in each package forms a plurality of conductive pads including peripheral conductive pads distributed near a side wall of the molding compound of the package, and each peripheral conductive pads has a side surface;
    over etching each of the peripheral conductive pads to form an undercut at the side surface of the peripheral conductive pad, wherein each undercut has a concave surface curved inward relative to the side wall of the molding compound and having a height equal to a thickness of the peripheral conductive pads; and
    electroplating the lead frame to form a protection layer covering each of the conductive pads exposed from the bottom surface of the molding compound and the concave surface of each undercut.

2. The method as claimed in claim 1, before the step of electroplating the lead frame, the method further comprising steps of:
    re-mounting the plurality of the packages by turning over each package so that the bottom surface of the lead frame originally attached to the carrier is turned upward.

3. The method as claimed in claim 1, wherein in the step of electroplating the lead frame, a material of the protection layer is one of tin, aurum, silver and nickel-aurum.

4. The method as claimed in claim 1, wherein in the step of electroplating the lead frame, the protection layer is formed by one of an immersion tin process, an electroless nickel immersion gold (ENIG) process, a barrel plating process, and an immersion silver process.

* * * * *